United States Patent
Wang et al.

(10) Patent No.: US 8,846,275 B2
(45) Date of Patent: Sep. 30, 2014

(54) METHOD FOR MASK PATTERNS

(75) Inventors: Po-Chiao Wang, Miao-Li County (TW); Cheng-Pang Huang, Miao-Li County (TW); Yu-Chang Ho, Miao-Li County (TW)

(73) Assignee: Innolux Corporation (TW)

( * ) Notice: Subject to any disclaimer, the term of this patent is extended or adjusted under 35 U.S.C. 154(b) by 70 days.

(21) Appl. No.: 13/610,367

(22) Filed: Sep. 11, 2012

(65) Prior Publication Data
US 2013/0183610 A1 Jul. 18, 2013

(30) Foreign Application Priority Data

Jan. 18, 2012 (TW) .............................. 101101880 A

(51) Int. Cl.
*G03F 1/44* (2012.01)
*G03F 1/36* (2012.01)

(52) U.S. Cl.
USPC ............................................................ 430/5

(58) Field of Classification Search
USPC ............. 430/5, 311, 322, 323; 716/53, 54, 55
See application file for complete search history.

(56) References Cited

U.S. PATENT DOCUMENTS

| 7,435,512 B2 * | 10/2008 | Chang ................................ 430/5 |
| 2009/0096090 A1 | 4/2009 | Chang |
| 2009/0220868 A1 | 9/2009 | Lin et al. |
| 2012/0072874 A1 * | 3/2012 | Chiang et al. .................... 716/52 |

FOREIGN PATENT DOCUMENTS

| TW | 455747 | 9/2001 |
| TW | 200522149 | 7/2005 |
| TW | 200712745 | 4/2007 |

OTHER PUBLICATIONS

Office Action dated May 27, 2014 from corresponding application No. TW 101101880.

* cited by examiner

*Primary Examiner* — Stephen Rosasco
(74) *Attorney, Agent, or Firm* — Lowe Hauptman & Ham, LLP

(57) ABSTRACT

A design method for mask patterns is provided. The design method includes providing an exposure machine with a mask including an optical proximity correction (OPC) pattern including a first clear area and a first dark area, wherein the first clear area surrounds the first dark area, placing a substrate in the exposure machine, and exposing the substrate to light to form an imaged pattern on the substrate, wherein the imaged pattern has an area smaller than that of the optical proximity correction (OPC) pattern.

11 Claims, 6 Drawing Sheets

METHOD FOR MASK PATTERNS

CROSS REFERENCE TO RELATED APPLICATIONS

This Application claims priority of Taiwan Patent Application No. 101101880, filed on Jan. 18, 2012, the entirety of which is incorporated by reference herein.

BACKGROUND OF THE INVENTION

1. Field of the Invention

The invention relates to a design method for mask patterns, and in particular to a design method for mask patterns combined with an optical proximity correction (OPC) technique.

2. Description of the Related Art

A proximity (for example NSK) exposure machine is commonly utilized in low-resolution layer fabrication. As the market demand for high pixel density devices is increase, development of a technique capable of improving the resolution of the proximity exposure machine is desirable.

BRIEF SUMMARY OF THE INVENTION

One embodiment of the invention provides a design method for mask patterns, comprising: providing an exposure machine with a mask comprising an optical proximity correction (OPC) pattern comprising a first clear area and a first dark area, wherein the first clear area surrounds the first dark area; placing a substrate in the exposure machine; and exposing the substrate to light to form an imaged pattern on the substrate, wherein the imaged pattern has an area smaller than that of the optical proximity correction (OPC) pattern.

In accordance with the present design method for mask patterns of the invention, the resolution of the proximity exposure and the aperture ratio of products are simultaneously improved.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

One embodiment of the invention provides a design method for mask patterns, comprising the following steps. First, an exposure machine with a mask is provided. Specifically, the mask comprises an optical proximity correction (OPC) pattern comprising a first clear area and a first dark area. The first clear area surrounds the first dark area. A substrate is then placed in the exposure machine. Next, the substrate is exposed to light to form an imaged pattern on the substrate. Specifically, the imaged pattern has an area smaller than that of the optical proximity correction (OPC) pattern.

In an embodiment, the exposure machine may be a proximity exposure machine.

Referring to FIGS. 1-5, some of the optical proximity correction (OPC) patterns of the invention are shown.

Figure 1:
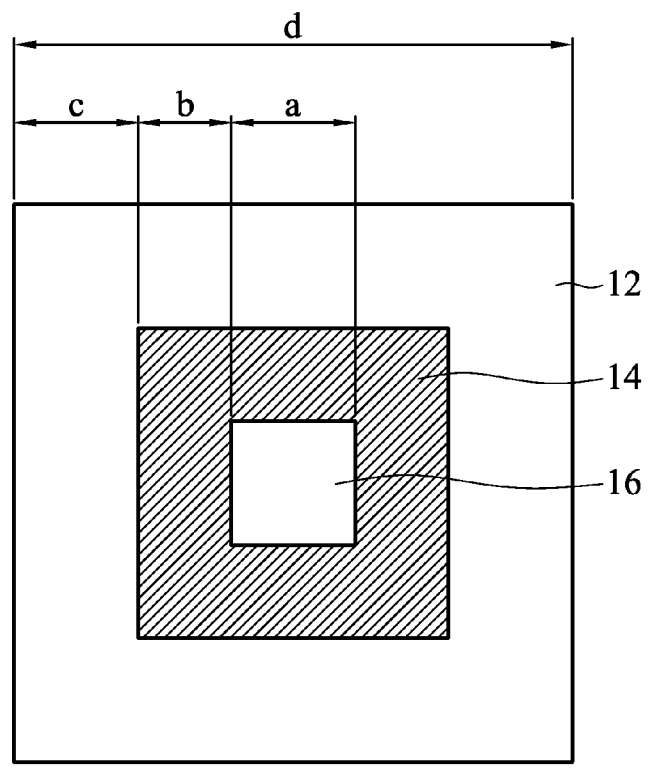
FIG. 1 shows a top view of an optical proximity correction (OPC) pattern according to an embodiment of the invention.

First, referring to FIG. 1, in accordance with one embodiment of the invention, an optical proximity correction (OPC) pattern 10 comprises a first clear area 12, a first dark area 14 and a second clear area 16 from the outside to an inside thereof. The first clear area 12 surrounds the first dark area 14. The first dark area 14 surrounds the second clear area 16. In this embodiment, the second clear area 16 is in a shape of a rectangle with a width (a) of about 1-3 µm, preferably 2 µm. The first dark area 14 is in a shape of a circle with a width (b) of the circular path thereof of about 1-3 µm, preferably 1.5 µm. The first clear area 12 is in a shape of a circle with a width (c) of the circular path thereof of about 1.5-4 µm, preferably 2 µm. Thus, the optical proximity correction (OPC) pattern 10 has a width (d) of about 6-17 µm, preferably 9 µm. In other embodiments, the second clear area 16 may also be in a shape of a polygon, circle or ellipse.

Figure 2:
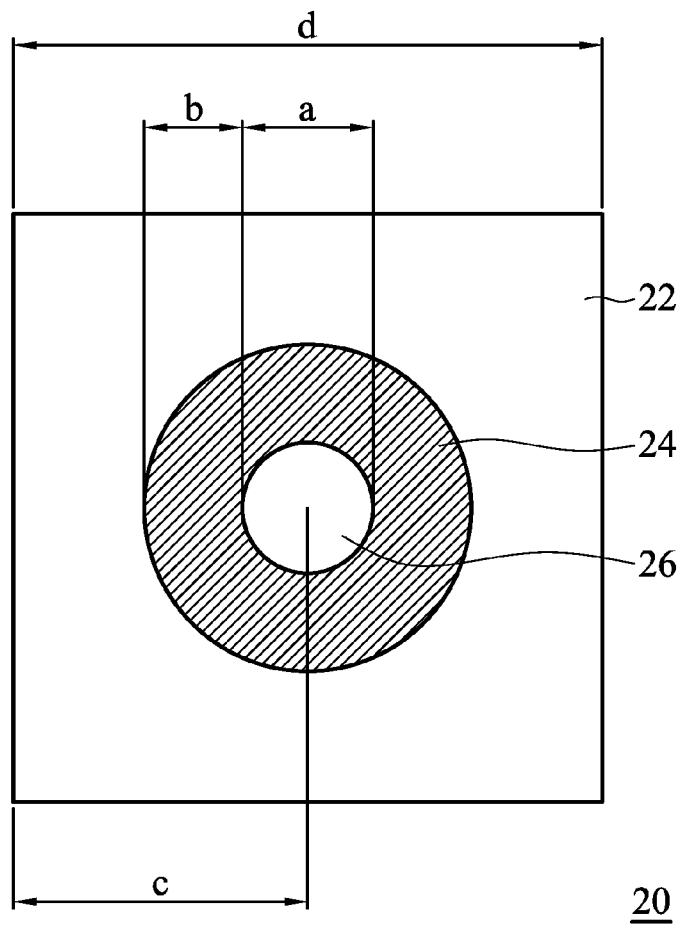
FIG. 2 shows a top view of an optical proximity correction (OPC) pattern according to an embodiment of the invention.

Next, referring to FIG. 2, in accordance with another embodiment of the invention, an optical proximity correction (OPC) pattern 20 comprises a first clear area 22, a first dark area 24 and a second clear area 26 from the outside to an inside thereof. The first clear area 22 surrounds the first dark area 24. The first dark area 24 surrounds the second clear area 26. In this embodiment, the second clear area 26 is in a shape of a circle with a diameter (a) of about 1-3 µm, preferably 2 µm. The first dark area 24 is in a shape of a circle with a width (b) of the circular path thereof of about 1-3 µm, preferably 1.5 µm. The first clear area 22 is in a shape of a circle with a shortest distance (c) from the center to the edge thereof of about 2.5-9 µm, preferably 4.5 µm. Thus, the optical proximity correction (OPC) pattern 20 has a width (d) of about 5-18 µm, preferably 9 µm. In other embodiments, the second clear area 26 may also be in a shape of a polygon, rectangle or ellipse.

Figure 3:
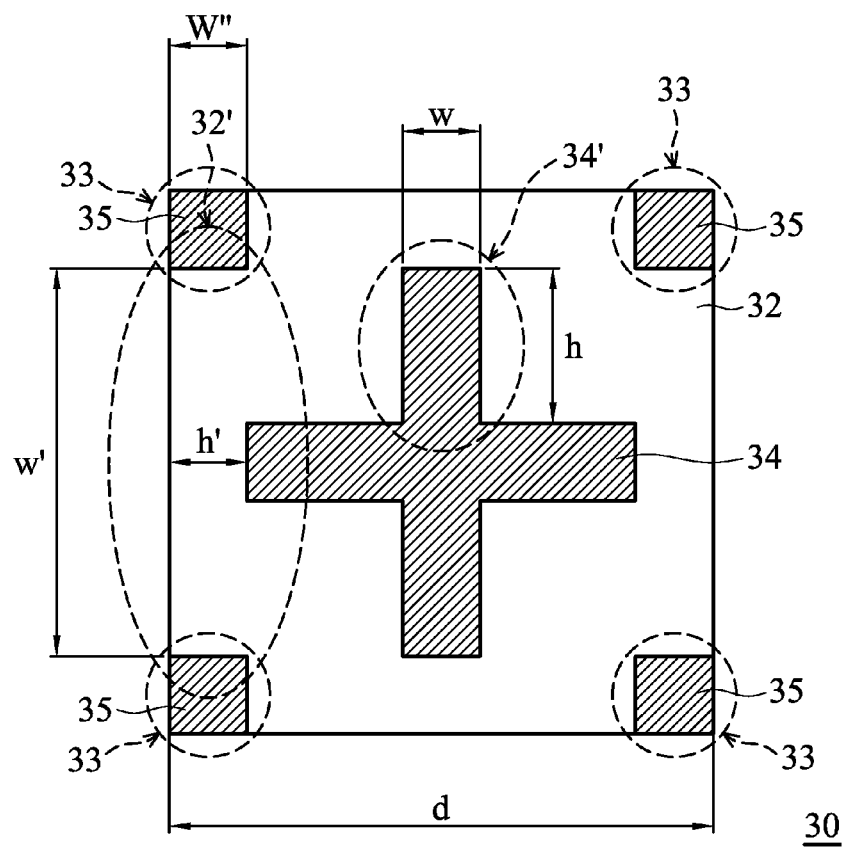
FIG. 3 shows a top view of an optical proximity correction (OPC) pattern according to an embodiment of the invention.

Next, referring to FIG. 3, in accordance with another embodiment of the invention, an optical proximity correction (OPC) pattern 30 comprises a first clear area 32 and a first dark area 34 from the outside to an inside thereof. The first clear area 32 surrounds the first dark area 34. In this embodiment, the first dark area 34 is in a shape of a cross with a height (h) of a protrusion 34' thereof of about 2-3.5 µm, preferably 3 µm, with a width (w) of the protrusion 34' thereof of about 2-3.5 µm, preferably 2 µm. The first clear area 32 has at least one chamfered corner 33 such that the first clear area 32 is in a shape of, for example, a cross with a height (h') of a protrusion 32' thereof of about 1.5-3 µm, preferably 2 µm, with a width (w') of the protrusion 32' thereof of about 6-10.5 µm, preferably 8 µm. In this embodiment, the optical proximity correction (OPC) pattern 30 further comprises at least one second dark area 35 disposed in the chamfered corner 33 of the first clear area 32. Preferably, the four second dark areas 35 are disposed in the four chamfered corners 33 of the first clear area 32, as shown in FIG. 3. The second dark area 35 has a width (w") of about 1.5-3 µm, preferably 2 µm. Thus, the optical proximity correction (OPC) pattern 30 has a width (d) of about 9-16.5 µm, preferably 12 µm.

Figure 4:
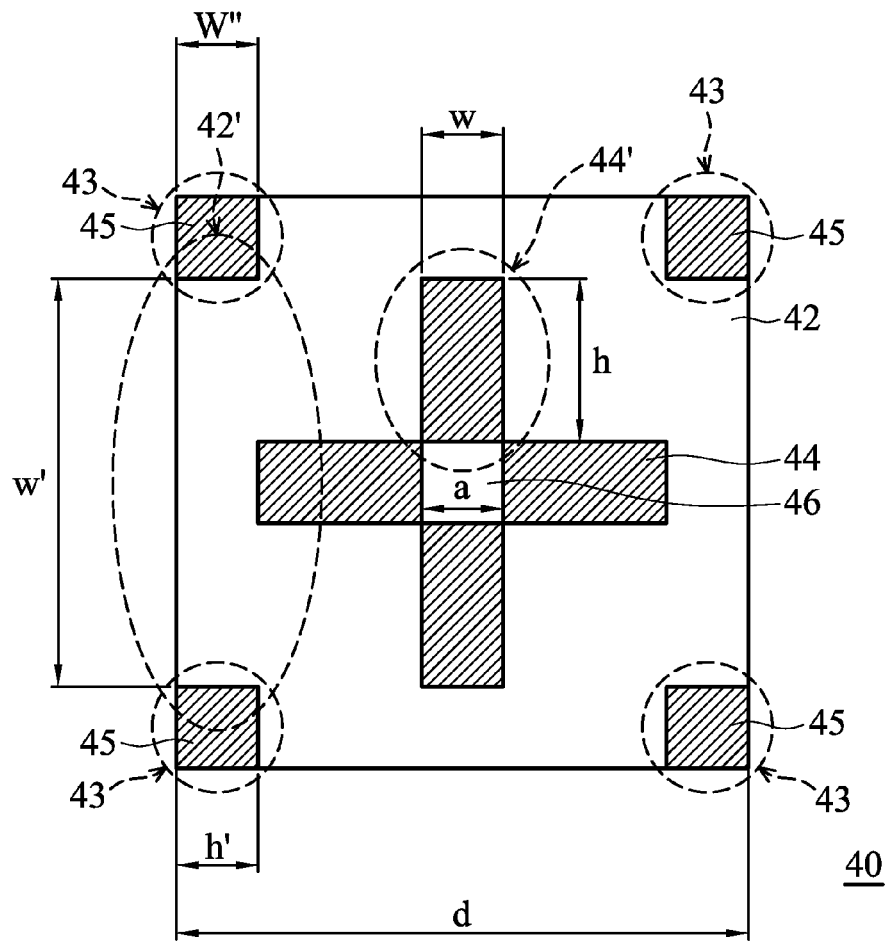
FIG. 4 shows a top view of an optical proximity correction (OPC) pattern according to an embodiment of the invention.

Next, referring to FIG. 4, in accordance with another embodiment of the invention, an optical proximity correction (OPC) pattern 40 comprises a first clear area 42, a first dark area 44 and a second clear area 46 from the outside to an inside thereof. The first clear area 42 surrounds the first dark area 44. The second clear area 46 is disposed in the center of the first dark area 44. In this embodiment, the second clear area 46 is in a shape of a rectangle with a width (a) of about 2-3 µm, preferably 2 µm. The first dark area 44 is in a shape of a cross with a height (h) of a protrusion 44' thereof of about 2-4 µm, preferably 3 µm, with a width (w) of the protrusion 44' thereof of about 1.5-3 µm, preferably 2 µm. The first clear area 42 has at least one chamfered corner 43 such that the first clear area 42 is in a shape of, for example, a cross with a height (h') of a protrusion 42' thereof of about 1.5-3 µm, preferably 2 µm, with a width (w') of the protrusion 42' thereof of about 6-10.5 µm, preferably 8 µm. In this embodiment, the optical proximity correction (OPC) pattern 40 further comprises at least one second dark area 45 disposed in the chamfered corner 43 of the first clear area 42. Preferably, the four second dark areas 45 are disposed in the four chamfered corners 43 of the first clear area 42, as shown in FIG. 4. The second dark area 45 has a width (w") of about 1.5-3 µm, preferably 2 µm. Thus, the optical proximity correction (OPC) pattern 40 has a width (d) of about 9-16 µm, preferably 12 µm. In other embodiments, the second clear area 46 may also be in a shape of a polygon, circle or ellipse.

Figure 5:
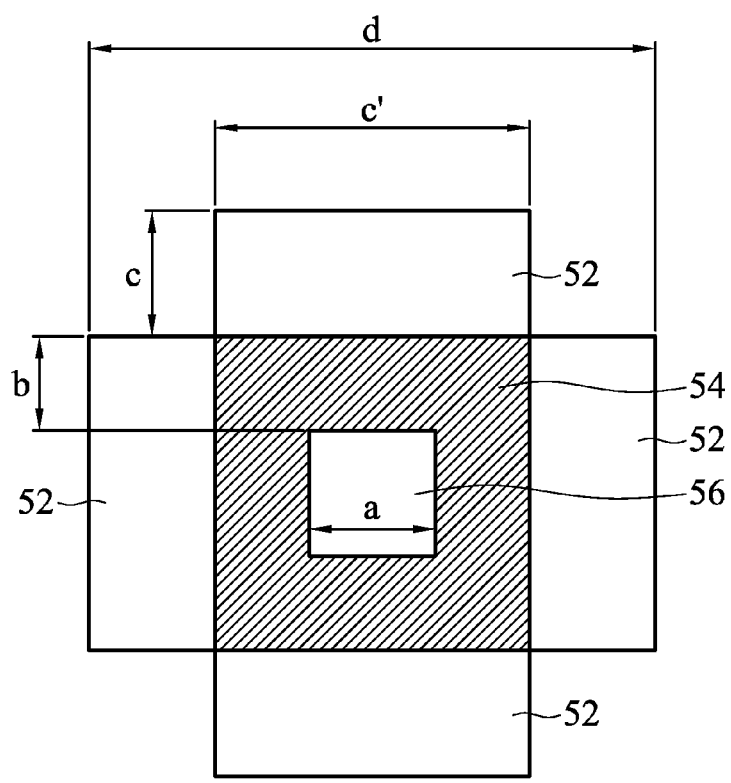
FIG. 5 shows a top view of an optical proximity correction (OPC) pattern according to an embodiment of the invention.

Next, referring to FIG. 5, in accordance with another embodiment of the invention, an optical proximity correction (OPC) pattern 50 comprises a plurality of first clear areas 52, a first dark area 54 and a second clear area 56 from the outside to an inside thereof. The first clear areas 52 are separated each other. The first dark area 54 surrounds the second clear area 56. In this embodiment, the second clear area 56 is in a shape of a rectangle with a width (a) of about 2-3 µm, preferably 2 µm. The first dark area 54 is in a shape of a circle with a width (b) of the circular path thereof of about 1.5-3 µm, preferably 1.5 µm. The first clear area 52 is in a shape of a rectangle with a length (c) of the shorter side thereof of about 2-3 µm, preferably 2 µm, with a length (c') of the longer side thereof of about 5-9 µm, preferably 5 µm. Thus, the optical proximity correction (OPC) pattern 50 has a width (d) of about 9-15 µm, preferably 11 µm. In other embodiments, the second clear area 56 may also be in a shape of a polygon, circle or ellipse.

The exposure machine is further combined with a filter which allows light with 400-436 nm to pass therethrough (for example a filter 1) or allows light with 300-400 nm to pass therethrough (for example a filter 2) to serve as an exposure light source. In accordance with various process conditions of the invention, the filter 1 or the filter 2 is properly selected.

A gap between the mask and the substrate is about 100-160 µm.

The imaged pattern formed on the substrate may be a via hole pattern.

In the invention, the average critical dimension (cd) of the exposed via hole pattern is reduced to less than 5 m and the variation range of the critical dimension (cd) is narrowed to 2 m due to combination of the optical proximity correction (OPC) pattern technique and the filter capable of filtering out light with a specific wavelength disposed in the light source system of the exposure machine. The process window provided by the invention is equal to or superior to the current process window which generates products with an average critical dimension (cd) of 7 µm.

COMPARATIVE EXAMPLE 1

Figure 6:
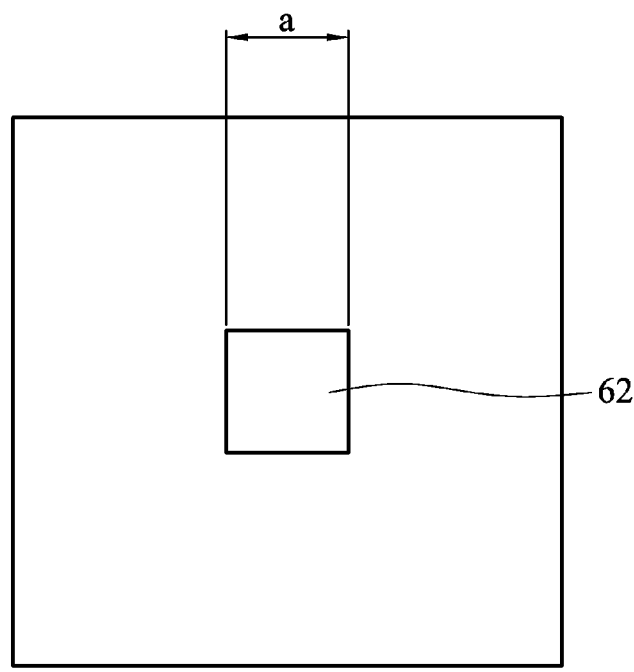
FIG. 6 shows a top view of a conventional mask pattern.

The Critical Dimension (cd) of a Conventional Exposed Pattern and the Variation Range Thereof First, a proximity NSK exposure machine with a mask was provided. A pattern 60 drawn on the mask was as shown in FIG. 6. The pattern 60 comprised a clear area 62. The clear area 62 was in a shape of a rectangle. In this comparative example, the width (a) of the clear area 62 was 7 µm. A substrate was then placed in the exposure machine. A gap between the mask and the substrate was 140 µm. Next, the substrate was exposed to light to form a via hole pattern (imaged pattern) on the substrate. Finally, the imaged pattern was measured. The average critical dimension (cd) thereof was 7.14 µm. The average variation range thereof was 2.13 µm.

EXAMPLE 1

The Critical Dimension (cd) of the Present Exposed Pattern and the Variation Range Thereof First, a proximity NSK exposure machine with a mask was provided. An optical proximity correction (OPC) 10 drawn on the mask was as shown in FIG. 1. In this example, a second clear area 16 had a width (a) of 2 µm. A first dark area 14 had a width (b) of the circular path thereof of 1.5 µm. A first clear area 12 had a width (c) of the circular path thereof of 3 µm. A substrate was then placed in the exposure machine. A gap between the mask and the substrate was 140 µm. Next, the substrate was exposed to light to form a via hole pattern (imaged pattern) on the substrate. Finally, the imaged pattern was measured. The average critical dimension (cd) thereof was 5.69 µm. The average variation range thereof was 2.04 µm.

COMPARATIVE EXAMPLE 2

The Critical Dimension (cd) of a Conventional Exposed Pattern and the Variation Range Thereof First, a proximity NSK exposure machine with a mask was provided. A pattern 60 drawn on the mask was as shown in FIG. 6. In this comparative example, the width (a) of the clear area 62 was 7 µm. A substrate was then placed in the exposure machine. A gap between the mask and the substrate was 160 µm. Next, the substrate was exposed to light to form a via hole pattern (imaged pattern) on the substrate. Finally, the imaged pattern was measured. The average critical dimension (cd) thereof was 7.12 µm. The average variation range thereof was 2.93 µm.

EXAMPLE 2

The Critical Dimension (cd) of the Present Exposed Pattern and the Variation Range Thereof First, a proximity NSK exposure machine with a mask was provided. An optical proximity correction (OPC) 10 drawn on the mask was as shown in FIG. 1. In this example, a second clear area 16 had a width (a) of 2 µm. A first dark area 14 had a width (b) of the circular path thereof of 1.5 µm. A first clear area 12 had a width (c) of the circular path thereof of 3 µm. A substrate was then placed in the exposure machine. A gap between the mask and the substrate was 160 µm. Next, the substrate was exposed to light to form a via hole pattern (imaged pattern) on the substrate. Finally, the imaged pattern was measured. The average critical dimension (cd) thereof was 5.72 µm. The average variation range thereof was 2.45 µm.

In the invention, the average critical dimension (cd) of the exposed via hole pattern is reduced to less than 5 µm and the variation range of the critical dimension (cd) is narrowed to 2

µm due to combination of the optical proximity correction (OPC) pattern technique and the filter capable of filtering out light with a specific wavelength disposed in the light source system of the exposure machine. The process window provided by the invention is equal to or superior to the current process window which products 7 µm products.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A design method for mask patterns, comprising:
   providing an exposure machine with a mask comprising an optical proximity correction (OPC) pattern comprising a first clear area and a first dark area, wherein the first clear area surrounds the first dark area, the first clear area is a continuous clear area and the first dark area is a continuous dark area;
   placing a substrate in the exposure machine; and
   exposing the substrate to light to form an imaged pattern on the substrate, wherein the imaged pattern has an area smaller than that of the optical proximity correction (OPC) pattern.

2. The design method for mask patterns as claimed in claim 1, wherein the exposure machine is a proximity exposure machine.

3. The design method for mask patterns as claimed in claim 1, wherein the optical proximity correction (OPC) pattern further comprises a second clear area surrounded by the first dark area.

4. The design method for mask patterns as claimed in claim 3, wherein the second clear area is in a shape of a rectangle, polygon, circle or ellipse.

5. The design method for mask patterns as claimed in claim 3, wherein the first clear area comprises a plurality of separated areas.

6. The design method for mask patterns as claimed in claim 5, wherein the second clear area is in a shape of a rectangle, polygon, circle or ellipse.

7. The design method for mask patterns as claimed in claim 1, wherein the first dark area is in a shape of a cross.

8. The design method for mask patterns as claimed in claim 7, wherein the first clear area has at least one chamfered corner and the optical proximity correction (OPC) pattern further comprises at least one second dark area disposed in the chamfered corner of the first clear area.

9. The design method for mask patterns as claimed in claim 7, wherein the optical proximity correction (OPC) pattern further comprises a second clear area disposed in the center of the first dark area and the second clear area is in a shape of a rectangle, polygon, circle or ellipse.

10. The design method for mask patterns as claimed in claim 9, wherein the first clear area has at least one chamfered corner and the optical proximity correction (OPC) pattern further comprises at least one second dark area disposed in the chamfered corner of the first clear area.

11. The design method for mask patterns as claimed in claim 1, wherein the imaged pattern is a via hole pattern.

\* \* \* \* \*